(12) United States Patent
Cheng et al.

(10) Patent No.: US 9,048,263 B2
(45) Date of Patent: Jun. 2, 2015

(54) MANUFACTURING METHOD OF NON-VOLATILE MEMORY

(71) Applicant: MACRONIX International Co., Ltd., Hsinchu (TW)

(72) Inventors: Chih-Chieh Cheng, Hsinchu (TW); Shih-Guei Yan, Hsinchu (TW); Cheng-Hsien Cheng, Hsinchu (TW); Wen-Jer Tsai, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/314,830

(22) Filed: Jun. 25, 2014

(65) Prior Publication Data

US 2014/0308791 A1 Oct. 16, 2014

Related U.S. Application Data

(62) Division of application No. 13/271,517, filed on Oct. 12, 2011, now Pat. No. 8,791,522.

(51) Int. Cl.

| | | |
|---|---|---|
| *H01L 21/8247* | (2006.01) | |
| *H01L 29/66* | (2006.01) | |
| *H01L 29/423* | (2006.01) | |
| *H01L 29/788* | (2006.01) | |
| *H01L 29/792* | (2006.01) | |
| *H01L 27/115* | (2006.01) | |

(52) U.S. Cl.
CPC .... *H01L 29/66833* (2013.01); *H01L 29/42332* (2013.01); *H01L 29/42336* (2013.01); *H01L 29/66825* (2013.01); *H01L 29/7887* (2013.01); *H01L 29/7923* (2013.01); *H01L 27/11521* (2013.01); *H01L 27/11568* (2013.01)

(58) Field of Classification Search
None
See application file for complete search history.

(56) References Cited

U.S. PATENT DOCUMENTS

| | | | | |
|---|---|---|---|---|
| 5,284,784 | A * | 2/1994 | Manley | 438/263 |
| 5,483,094 | A * | 1/1996 | Sharma et al. | 257/316 |
| 5,920,783 | A * | 7/1999 | Tseng et al. | 438/305 |
| 6,091,101 | A * | 7/2000 | Wang | 257/315 |
| 6,133,098 | A * | 10/2000 | Ogura et al. | 438/267 |
| 6,187,636 | B1 * | 2/2001 | Jeong | 438/267 |
| 6,417,049 | B1 * | 7/2002 | Sung et al. | 438/266 |

(Continued)

FOREIGN PATENT DOCUMENTS

| | | |
|---|---|---|
| CN | 101022113 | 8/2007 |
| TW | 444331 | 7/2001 |

(Continued)

OTHER PUBLICATIONS

"Office Action of Taiwan Counterpart Application", issued on Nov. 13, 2014, p. 1-p. 6.

*Primary Examiner* — Zandra Smith
*Assistant Examiner* — Molly Reida
(74) *Attorney, Agent, or Firm* — J.C. Patents (57) ABSTRACT

A non-volatile memory and a manufacturing method thereof are provided. In this method, a first oxide layer having a protrusion is formed on a substrate. A pair of doped regions is formed in the substrate at two sides of the protrusion. A pair of charge storage spacers is formed on the sidewalls of the protrusion. A second oxide layer is formed on the first oxide layer and the pair of charge storage spacers. A conductive layer is formed on the second oxide layer, wherein the conductive layer is located completely on the top of the pair of charge storage spacers.

15 Claims, 9 Drawing Sheets

(56) References Cited

U.S. PATENT DOCUMENTS

| | | | |
|---|---|---|---|
| 6,555,870 B1* | 4/2003 | Kirisawa | 257/324 |
| 2004/0119112 A1* | 6/2004 | Lojek | 257/316 |
| 2005/0237797 A1* | 10/2005 | Jeng | 365/185.01 |
| 2006/0006457 A1* | 1/2006 | Ono | 257/316 |
| 2007/0023820 A1* | 2/2007 | Yang et al. | 257/315 |
| 2007/0077706 A1* | 4/2007 | Orlowski et al. | 438/257 |
| 2007/0111357 A1* | 5/2007 | Wang et al. | 438/48 |
| 2007/0126053 A1* | 6/2007 | Lee | 257/324 |
| 2007/0205455 A1* | 9/2007 | Zheng et al. | 257/314 |

FOREIGN PATENT DOCUMENTS

| | | |
|---|---|---|
| TW | 200807573 | 2/2008 |
| TW | 200910465 | 3/2009 |

\* cited by examiner

MANUFACTURING METHOD OF NON-VOLATILE MEMORY

CROSS-REFERENCE TO RELATED APPLICATION

This application is a divisional application of and claims the priority benefit of U.S. application Ser. No. 13/271,517, filed on Oct. 12, 2011, now allowed. The entirety of the above-mentioned patent application is hereby incorporated by reference herein and made a part of this specification.

BACKGROUND OF THE INVENTION

1. Field of the Invention

The invention relates to a non-volatile memory (NVM) and a manufacturing method thereof. More particularly, the invention relates to a non-volatile memory capable of preventing second bit effect and program disturbance and a manufacturing method thereof.

2. Description of Related Art

Non-volatile memory has the advantage of saving the stored data after the power is turned off. Thus, this type of memory is adopted in many electronic products to maintain the operation of electronic products when turned on.

Nitride read only memory (ROM) is a common non-volatile memory nowadays. In a memory cell of a nitride ROM, a charge trapping structure constituted by a nitride layer can store two-bit data. Generally, two-bit data can be stored in the left side (that is, left bit) and the right side (that is, right bit) of the charge trapping structure respectively.

However, two bit effect is present in the nitride ROM. In other words, a read operation on the left bit is affected by the right bit, or a read operation on the right bit is affected by the left bit. Also, with the reduction in the size of memory, the length of the channel in the memory cell is reduced as well, such that the second bit effect is more severe, thereby affecting operation window and device performance.

Further, as the size of the memory decreases gradually, the distance between the memory cells decreases as well. Consequently, program disturbance easily results when adjacent memory cells undergo a program operation.

SUMMARY OF THE INVENTION

The embodiment of the invention provides a manufacturing method of a non-volatile memory capable of manufacturing a non-volatile memory that can prevent from generating second bit effect and program disturbance in operation.

The embodiment of the invention further provides a non-volatile memory capable of preventing the generation of second bit effect and program disturbance in operation.

The invention provides a manufacturing method of a non-volatile memory. In this method, a first oxide layer having a protrusion is formed on a substrate. A pair of doped regions is formed in the substrate at two sides of the protrusion. A pair of charge storage spacers is formed on the sidewalls of the protrusion. A second oxide layer is formed on the first oxide layer and the pair of charge storage spacers. A conductive layer is formed on the second oxide layer, wherein the conductive layer is located completely on the top of the pair of charge storage spacers.

According to the manufacturing method of the non-volatile memory in the embodiment of the invention, a method of forming the first oxide layer includes, for example, forming a first oxide material layer on the substrate. A patterning mask layer is formed on the first oxide material layer. The patterning mask layer is used as a mask to remove a portion of the first oxide material layer to forming the protrusion. The patterning mask layer is then removed.

According to the manufacturing method of the non-volatile memory in the embodiment of the invention, the substrate located at two sides of the protrusion is not exposed after a portion of the first oxide material layer is removed.

According to the manufacturing method of the non-volatile memory in the embodiment of the invention, after the protrusion is formed and before the patterning mask layer is removed, the patterning mask layer is further adopted as the mask to perform an ion implantation process to form the pair of doped regions.

According to the manufacturing method of the non-volatile memory in the embodiment of the invention, a method of forming the pair of charge storage spacers includes, for example, forming a charge storage material layer on the first oxide layer conformally. An isotropic etching process is performed to remove a portion of the charge storage material layer.

According to the manufacturing method of the non-volatile memory in the embodiment of the invention, a method of forming the pair of charge storage spacers includes, for example, forming a charge storage material layer on the first oxide layer conformally. A second oxide material layer is formed on the charge storage material layer. An isotropic etching process is performed to remove a portion of the second oxide material layer and a portion of the charge storage material layer.

According to the manufacturing method of the non-volatile memory in the embodiment of the invention, after the protrusion is formed and before the patterning mask layer is removed, a pair of nitride spacers is formed on the sidewalls of the patterning mask layer and the the protrusion. The patterning mask layer and the pair of nitride spacers are used as a mask to perform an ion implantation process to form the pair of doped regions.

According to the manufacturing method of the non-volatile memory in the embodiment of the invention, the pair of nitride spacers is removed while removing the patterning mask layer.

According to the manufacturing method of the non-volatile memory in the embodiment of the invention, a method of forming the pair of charge storage spacers includes, for example, forming a charge storage material layer on the first oxide layer conformally. An isotropic etching process is performed to remove a portion of the charge storage material layer.

According to the manufacturing method of the non-volatile memory in the embodiment of the invention, after the pair of doped regions is formed and before the patterning mask layer is removed, the manufacturing method further includes forming a third oxide layer to cover the patterning mask layer, the pair of nitride spacers, and the first oxide layer.

According to the manufacturing method of the non-volatile memory in the embodiment of the invention, a method of removing the patterning mask layer includes, for instance, performing a planarization process to remove the patterning mask layer, a portion of the pair of nitride spacers, and a portion of the third oxide layer until the protrusion is exposed and the pair of charge storage spacers is formed.

According to the manufacturing method of the non-volatile memory in the embodiment of the invention, the substrate located at two sides of the protrusion is exposed after a portion of the first oxide material layer is removed.

According to the manufacturing method of the non-volatile memory in the embodiment of the invention, after the protrusion is formed and before the patterning mask layer is removed, the patterning mask layer is further adopted as the mask to perform an ion implantation process to form the pair of doped regions.

According to the manufacturing method of the non-volatile memory in the embodiment of the invention, a method of forming the pair of charge storage spacers includes, for example, forming a third oxide layer conformally on the first oxide layer. A charge storage material layer is formed on the third oxide layer conformally. An isotropic etching process is performed to remove a portion of the charge storage material layer.

According to the manufacturing method of the non-volatile memory in the embodiment of the invention, a material of the charge storage spacers comprises nitride, polysilicon, high-k material, $Hf_xO_y$, $HfO_xN_y$, $Al_xO_y$, or $Hf_xAl_yO_z$, for example.

The invention further provides a non-volatile memory including a substrate, a charge storage structure, a first doped region, a second doped region, and a gate. The charge storage structure is disposed on the substrate. The first doped region and the second doped region are disposed in the substrate at two sides of the charge storage structure respectively. The gate is disposed on the charge storage structure. The charge storage structure includes a dielectric main body, a first charge storage spacer, and a second charge storage spacer. The first charge storage spacer and the second charge storage spacer are disposed in the dielectric main body in mirror symmetry and separated from each other. The first charge storage spacer is adjacent to the first doped region and the second charge storage spacer is adjacent to the second doped region. The first charge storage spacer and the second charge storage spacer have an L shape respectively. A horizontal portion of the first charge storage spacer and a horizontal portion of the second charge storage spacer extend away from each other. Or, the first charge storage spacer and the second charge storage spacer have a curved surface or a slanted surface respectively, and the curved surface or the slanted surface of the first charge storage spacer and the curved surface or the slanted surface of the second charge storage spacer are away from each other.

According to the non-volatile memory in the embodiment of the invention, a material of the first charge storage spacer and the second charge storage spacer is nitride, polysilicon, high-k material, $Hf_xO_y$, $HfO_xN_y$, $Al_xO_y$ or $Hf_xAl_yO$, for example.

According to the non-volatile memory in the embodiment of the invention, a thickness of the first charge storage spacer and the second charge storage spacer ranges from 40 Å to 80 Å, for instance.

In light of the foregoing, the charge storage spacers formed on the sidewalls of the oxide protrusion is adopted as the charge storage regions in the invention. The charges are thus respectively confined in the charge storage spacers effectively to prevent the second bit effect during the read operation and prevent the program disturbance of adjacent memory cells during the program operation. Further, by adjusting the thickness of the charge storage material layer in the invention, the size of the charge storage spacers formed therefrom can be controlled to prevent the size of the charge storage spacers from being too small which in term affects the ability of the memory to store charges.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate embodiments and, together with the description, serve to explain the principles of the invention.

DESCRIPTION OF EMBODIMENTS

First Embodiment

Figure 1A:
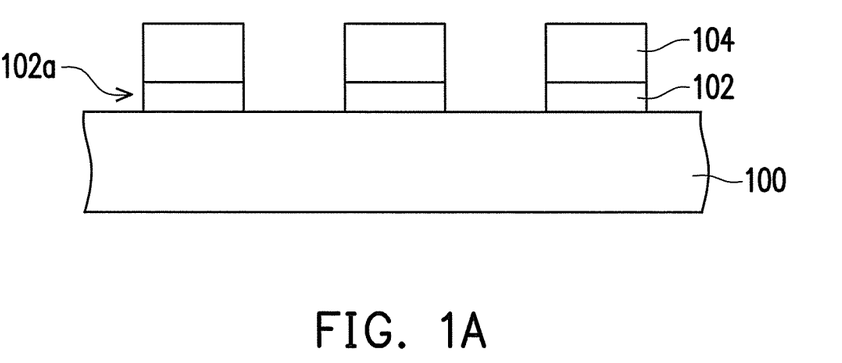
FIGS. 1A to 1D are schematic cross-sectional diagrams showing a flowchart for manufacturing a non-volatile memory according to a first embodiment of the invention.

FIGS. 1A to 1D are schematic cross-sectional diagrams showing a flowchart for manufacturing a non-volatile memory according to a first embodiment of the invention. Referring to FIG. 1A, an oxide layer 102 having a protrusion 102a is formed on a substrate 100. The oxide layer 102 is formed by forming an oxide material layer on the substrate 100, for example. A method of forming the oxide material layer is, for example, a chemical vapor deposition (CVD) method. Thereafter, a patterning mask layer 104 is formed on the oxide material layer. The patterning mask layer 104 covers a region for forming the protrusion in the oxide layer 102. Afterwards, the patterning mask layer 104 is used as a mask to perform an isotropic etching process so as to remove a portion of the oxide material layer until the substrate 100 is exposed to form the protrusions 102a. In the present embodiment, since the oxide layer 102 not covered by the patterning mask layer 104 is removed, the oxide layer 102 remained constitutes the protrusions 102a.

Figure 1B:
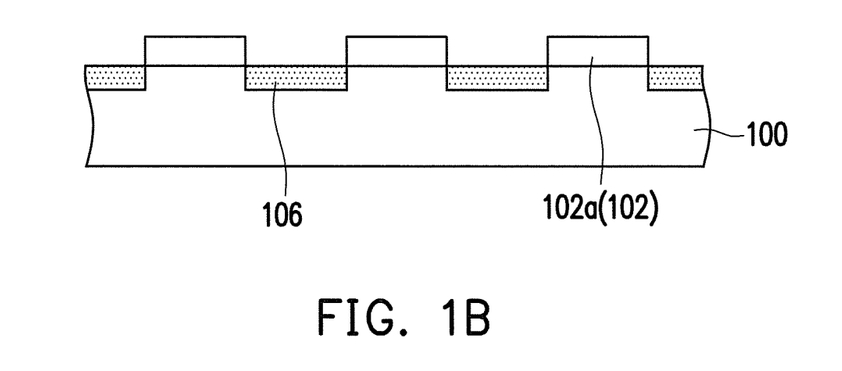

Referring to FIG. 1B, the patterning mask layer 104 is adopted as a mask to perform an ion implantation process so as to form a pair of doped regions 106 in the substrate 100 at two sides of each of the protrusions 102a (the oxide layer 102). The patterning mask layer 104 is then removed.

Figure 1C:
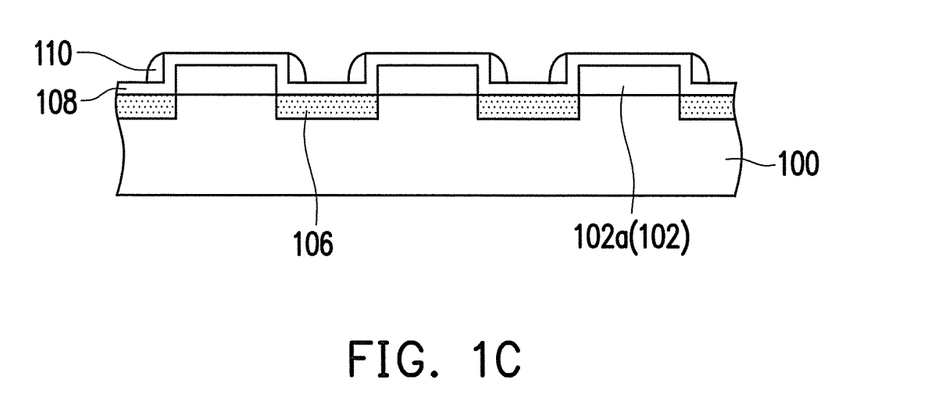

Referring to FIG. 1C, an oxide layer 108 is formed conformally on the substrate 100. A method of forming the oxide layer 108 is, for example, a CVD method. The oxide layer 108 covers the protrusions 102a (the oxide layer 102) and the doped regions 106. A pair of charge storage spacers 110 is then formed on the sidewalls of each of the protrusions 102a (the oxide layer 102). The charge storage spacers 110 are adopted as a charge storage region in a memory subsequently formed. A method of forming the charge storage spacers 110 includes the following. For example, a charge storage material layer is formed conformally on the oxide layer 108. A material of the charge storage material layer comprises nitride, polysilicon, high-k material, $Hf_xO_y$, $HfO_xN_y$, $Al_xO_y$ or $Hf_xAl_yO_z$, for example. A method of forming the charge storage material layer is, for example, a CVD method. An isotropic etching process is performed to remove a portion of the charge storage material layer. Accordingly, the size of the charge storage spacers 110 depends on the thickness of the charge storage material layer. In other words, the size of the charge storage spacers 110 can be controlled by adjusting the thickness of the charge storage material layer.

In the present embodiment, the thickness of the charge storage material layer ranges from 40 Å to 80 Å, for example. Consequently, charges can be stored and confined in the charge storage spacers 110 effectively after a voltage is applied to the memory formed. Further, since the thickness of the charge storage material layer ranges from 40 Å to 80 Å, the charge storage spacers 110 do not become too small so as to affect the ability of the memory to store charges.

Figure 1D:
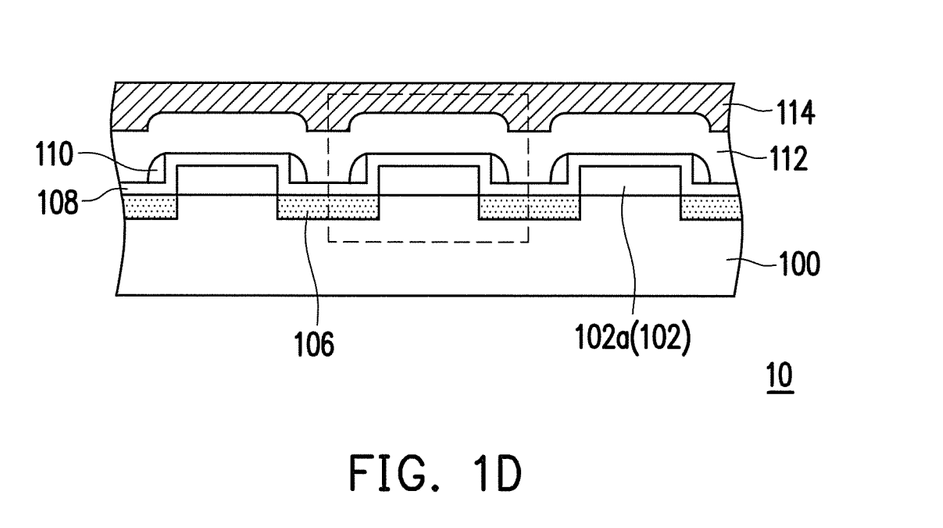

Referring to FIG. 1D, an oxide layer 112 is formed on the oxide layer 108 and the charge storage spacers 110. A method of forming the oxide layer 112 is, for example, a CVD method. A conductive layer 114 is then formed on the oxide layer 112 to form a non-volatile memory 10. A method of forming the conductive layer 114 is, for example, a CVD method. The conductive layer 114 is, for instance, a polysilicon layer.

The non-volatile memory 10 includes a plurality of memory cells as shown with dotted lines. Here, the protrusions 102a (the oxide layer 102), the oxide layer 108, the pair of charge storage spacers 110, and the oxide layer 112 constitute a charge storage structure (the protrusions 102a, the oxide layer 108, and the oxide layer 112 together are referred as a dielectric main body). The doped regions 106 disposed at two sides of the charge storage structure are used as a source region and a drain region respectively. The conductive layer 114 is utilized as a gate. In each of the memory cells, since the two charge storage spacers 110 are separated from each other, the charges are effectively confined in the charge storage spacer 110 on the left side (that is, the left bit) and the charge storage spacer 110 on the right side (that is, the right bit) respectively so as to prevent the second bit effect during the read access operation. Moreover, since the charges are confined in the charge storage spacers 110, the program disturbance of adjacent memory cells during the program operation is also prevented.

Second Embodiment

Figure 2A:
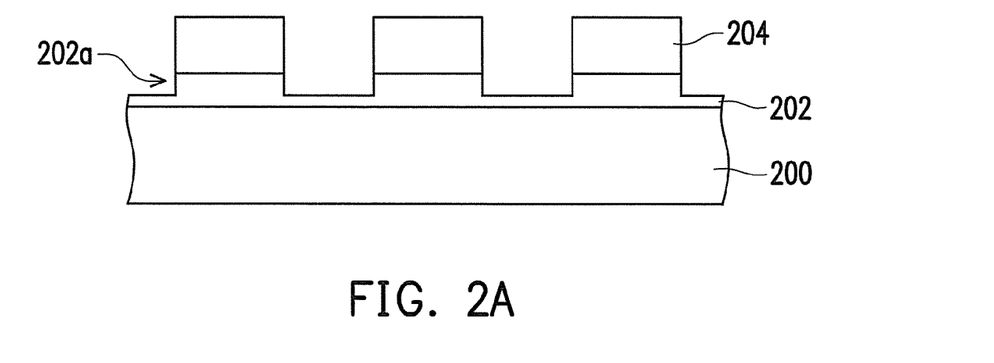
FIGS. 2A to 2C are schematic cross-sectional diagrams showing a flowchart for manufacturing a non-volatile memory according to a second embodiment of the invention.
Figure 2B:
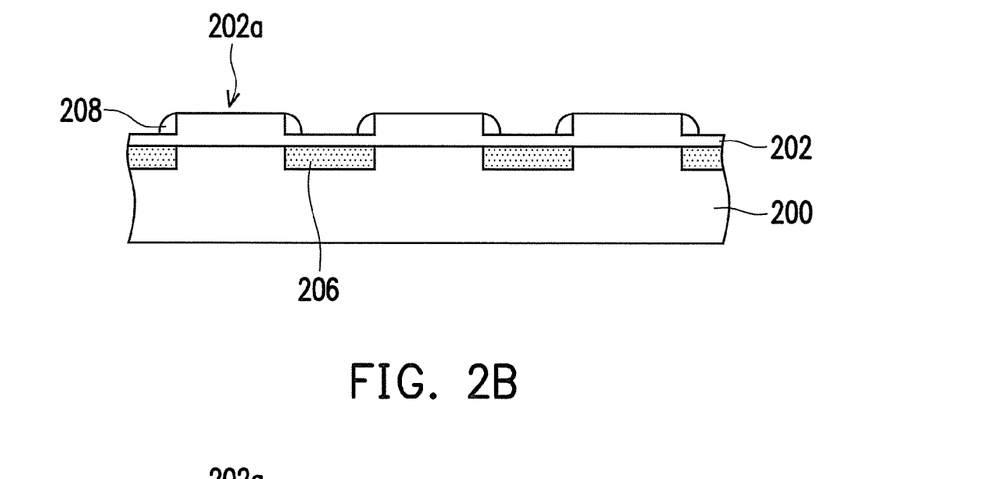
Figure 2C:
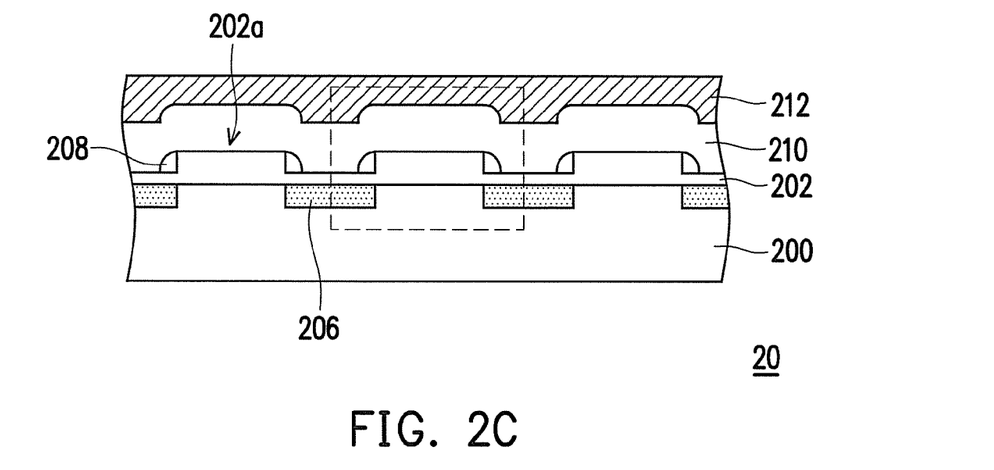

FIGS. 2A to 2C are schematic cross-sectional diagrams showing a flowchart for manufacturing a non-volatile memory according to a second embodiment of the invention. Referring to FIG. 2A, an oxide layer 202 having a protrusion 202a is formed on a substrate 200. The oxide layer 202 is formed by forming an oxide material layer on the substrate 200, for example. A method of forming the oxide material layer is, for example, a CVD method. Thereafter, a patterning mask layer 204 is formed on the oxide material layer. The patterning mask layer 204 covers a region for forming the protrusion in the oxide layer 202. Afterwards, the patterning mask layer 204 is used as a mask to perform an isotropic etching process so as to remove a portion of the oxide material layer without exposing the substrate 200 to form the protrusions 202a.

Referring to FIG. 2B, the patterning mask layer 204 is adopted as a mask to perform an ion implantation process so as to form a pair of doped regions 206 in the substrate 200 at two sides of each of the protrusions 202a. The patterning mask layer 204 is then removed. A pair of charge storage spacers 208 is then formed on the sidewalls of each of the protrusions 202a. The charge storage spacers 208 are adopted as a charge storage region in a memory subsequently formed. A method of forming the charge storage spacers 208 includes the following. For example, a charge storage material layer is formed conformally on the oxide layer 202. A material of the charge storage material layer comprises nitride, polysilicon, high-k material, $Hf_xO_y$, $HfO_xN_y$, $Al_xO_y$ or $Hf_xAl_yO_z$, for example. A method of forming the charge storage material layer is, for example, a CVD method. An isotropic etching process is performed to remove a portion of the charge storage material layer. Similar to the first embodiment, the size of the charge storage spacers 208 can be controlled by adjusting the thickness of the charge storage material layer. In the present embodiment, the thickness of the charge storage material layer ranges from 40 Å to 80 Å, for example. Accordingly, the size of the charge storage spacers 208 is prevented from being too small so as to affect the ability of the memory to store charges.

Referring to FIG. 2C, an oxide layer 210 is formed on the oxide layer 202 and the charge storage spacers 208. A method of forming the oxide layer 210 is, for example, a CVD method. A conductive layer 212 is then formed on the oxide layer 210 to form a non-volatile memory 20. A method of forming the conductive layer 212 is, for example, a CVD method. The conductive layer 212 is, for instance, a polysilicon layer.

The non-volatile memory 20 includes a plurality of memory cells as shown with dotted lines. Here, the oxide layer 202, the pair of charge storage spacers 208, and the oxide layer 210 constitute a charge storage structure (the oxide layer 202 and the oxide layer 210 together are referred as a dielectric main body). The doped regions 206 disposed at two sides of the charge storage structure are used as a source region and a drain region respectively. The conductive layer 212 is utilized as a gate. Similar to the non-volatile memory 10, the second bit effect can be prevented when performing the read operation to the memory cells of the non-volatile memory 20 and the program disturbance of adjacent memory cells can be prevented during the program operation.

Third Embodiment

Figure 3A:
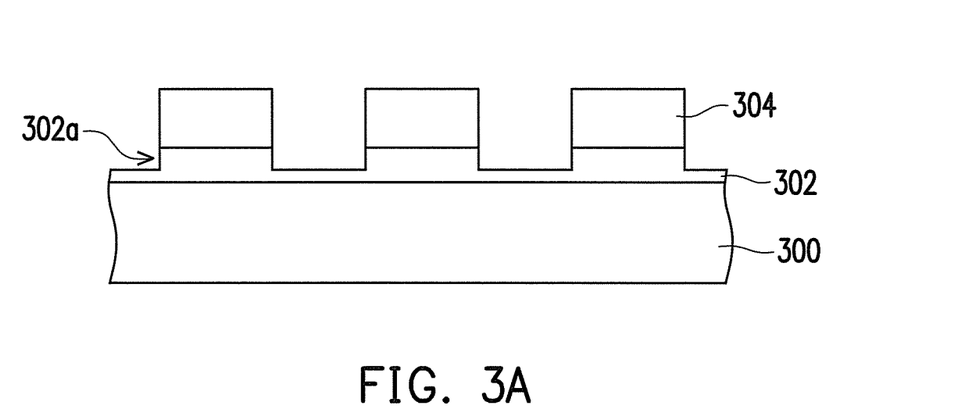
FIGS. 3A to 3D are schematic cross-sectional diagrams showing a flowchart for manufacturing a non-volatile memory according to a third embodiment of the invention.

FIGS. 3A to 3D are schematic cross-sectional diagrams showing a flowchart for manufacturing a non-volatile memory according to a third embodiment of the invention. Referring to FIG. 3A, an oxide layer 302 having a protrusion 302a is formed on a substrate 300. The oxide layer 302 is formed by forming an oxide material layer on the substrate 300, for example. A method of forming the oxide material layer is, for example, a CVD method. Thereafter, a patterning mask layer 304 is formed on the oxide material layer. The patterning mask layer 304 covers a region for forming the protrusion in the oxide layer 302. Afterwards, the patterning mask layer 304 is used as a mask to perform an isotropic etching process so as to remove a portion of the oxide material layer without exposing the substrate 300 to form the protrusions 302a.

Figure 3B:
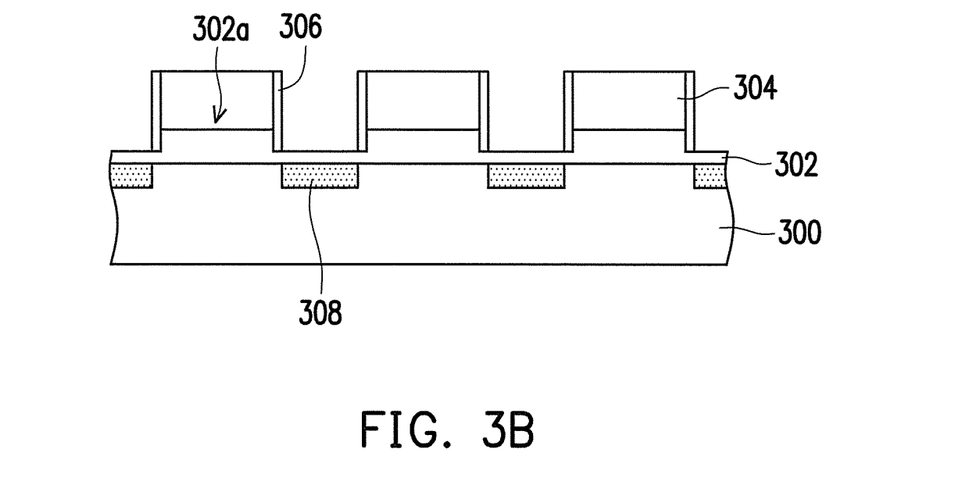

Referring to FIG. 3B, a pair of nitride spacers 306 is formed on the sidewalls of the patterning mask layer 304 and the protrusions 302a. A method of forming the nitride spacers 306 includes the following. For example, a nitride material layer is formed conformally on the oxide layer 302. An isotropic etching process is performed to remove a portion of the nitride material layer. The patterning mask layer 304 and the nitride spacers 306 are used as a mask to perform an ion implantation process to form the doped regions 308.

In the present embodiment, since the patterning mask layer 304 and the nitride spacers 306 are adopted as the mask to perform an ion implantation process while forming the doped regions 308, the doped regions 308 at two sides of each of the protrusions 302a have larger distance therebetween. As a result, the short channel effect and the punch through effect generated and affecting the device performance in the operation process of the memory subsequently formed can be prevented.

Figure 3C:
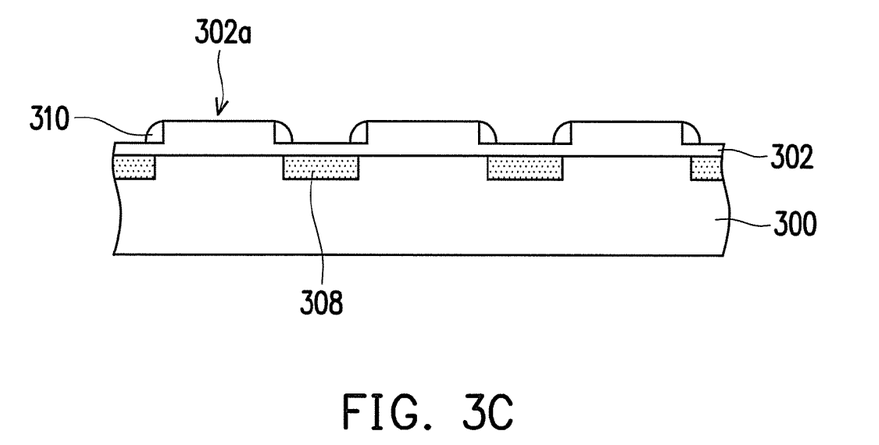

Referring to FIG. 3C, the patterning mask layer 304 and the nitride spacers 306 are removed. In the present embodiment, the patterning mask layer 304 and the nitride spacers 306 can be removed simultaneously. A pair of charge storage spacers 310 is then formed on the sidewalls of each of the protrusions 302a. The charge storage spacers 310 are adopted as a charge storage region in a memory subsequently formed. A method of forming the charge storage spacers 310 includes the following. For example, a charge storage material layer is formed conformally on the oxide layer 302. A material of the charge storage material layer comprises nitride, polysilicon, high-k material, $Hf_xO_y$, $HfO_xN_y$, $Al_xO_y$, or $Hf_xAl_yO_z$, for example. A method of forming the charge storage material layer is, for example, a CVD method. An isotropic etching process is performed to remove a portion of the charge storage material layer. Similar to the first embodiment, the size of the charge storage spacers 310 can be controlled by adjusting the thickness of the charge storage material layer formed. In the present embodiment, the thickness of the charge storage material layer ranges from 40 Å to 80 Å, for example. Accordingly, the size of the charge storage spacers 310 is prevented from being too small so as to affect the ability of the memory to store charges.

Figure 3D:
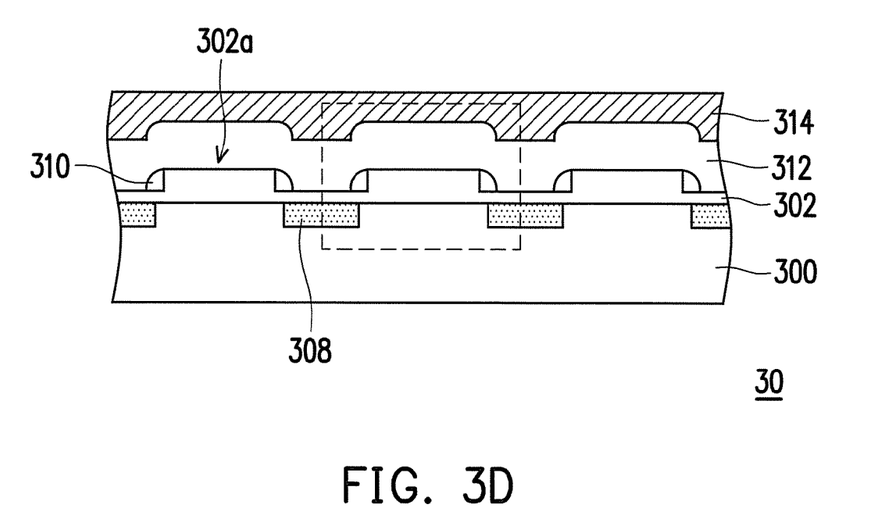

Referring to FIG. 3D, an oxide layer 312 is formed on the oxide layer 302 and the charge storage spacers 310. A method of forming the oxide layer 312 is, for example, a CVD method. A conductive layer 314 is then formed on the oxide layer 312 to form a non-volatile memory 30. A method of forming the conductive layer 314 is, for example, a CVD method. The conductive layer 314 is, for instance, a polysilicon layer.

The non-volatile memory 30 includes a plurality of memory cells as shown with dotted lines. Here, the oxide layer 302, the pair of charge storage spacers 310, and the oxide layer 312 constitute a charge storage structure (the oxide layer 302 and the oxide layer 312 together are referred as a dielectric main body). The doped regions 308 disposed at two sides of the charge storage structure are used as a source region and a drain region respectively. The conductive layer 314 is utilized as a gate. Similar to the non-volatile memory 10, the second bit effect can be prevented when performing the read operation to the memory cells of the non-volatile memory 30 and the program disturbance of adjacent memory cells can be prevented during the program operation. Furthermore, in the non-volatile memory 30, since a larger distance is present between the source region and the drain region, the short channel effect and the punch through effect are prevented in the operation process.

Fourth Embodiment

Figure 4A:
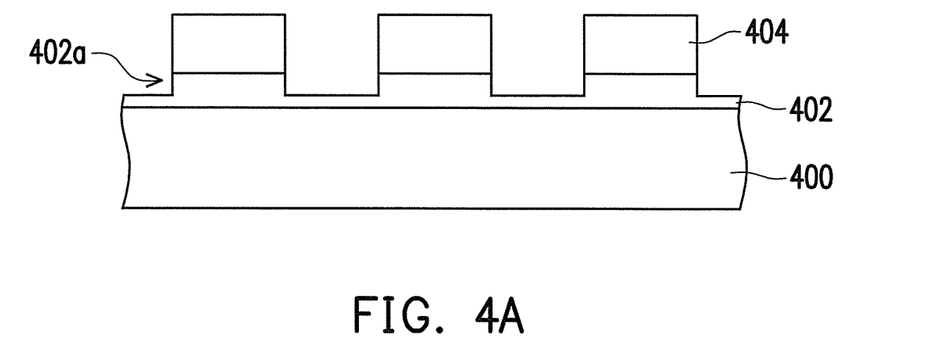
FIGS. 4A to 4D are schematic cross-sectional diagrams showing a flowchart for manufacturing a non-volatile memory according to a fourth embodiment of the invention.

FIGS. 4A to 4D are schematic cross-sectional diagrams showing a flowchart for manufacturing a non-volatile memory according to a fourth embodiment of the invention. Referring to FIG. 4A, an oxide layer 402 having a protrusion 402a is formed on a substrate 400. The oxide layer 402 is formed by forming an oxide material layer on the substrate 400, for example. A method of forming the oxide material layer is, for example, a CVD method. Thereafter, a patterning mask layer 404 is formed on the oxide material layer. The patterning mask layer 404 covers a region for forming the protrusion in the oxide layer 402. Afterwards, the patterning mask layer 404 is used as a mask to perform an isotropic etching process so as to remove a portion of the oxide material layer without exposing the substrate 400 to form the protrusions 402a.

Figure 4B:
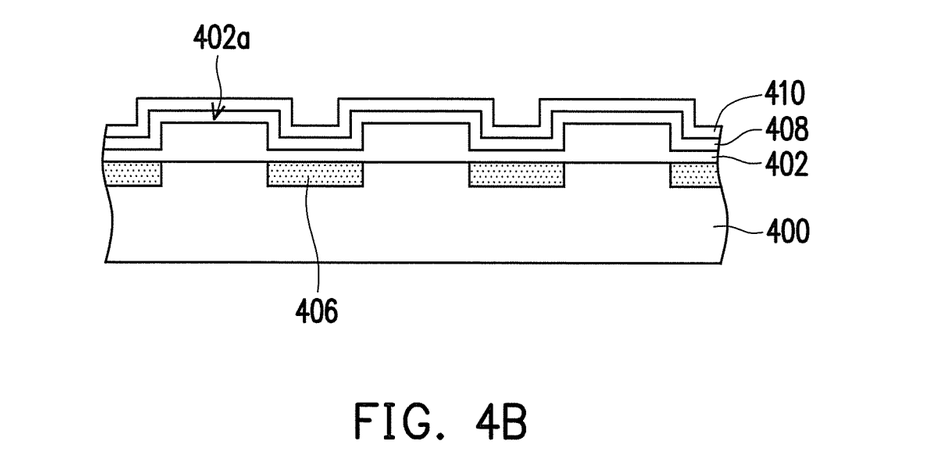

Referring to FIG. 4B, the patterning mask layer 404 is adopted as a mask to perform an ion implantation process so as to form a pair of doped regions 406 in the substrate 400 at two sides of each of the protrusions 402a. The patterning mask layer 404 is then removed. A charge storage material layer 408 is formed on the oxide layer 402 conformally. A material of the charge storage material layer 408 comprises nitride, polysilicon, high-k material, $Hf_xO_y$, $HfO_xN_y$, $Al_xO_y$, or $Hf_xAl_yO_z$, for example. A method of forming the charge storage material layer 408 is, for example, a CVD method. An oxide material layer 410 is formed on the charge storage material layer 408. A method of forming the oxide material layer 410 is, for example, a CVD method.

Figure 4C:
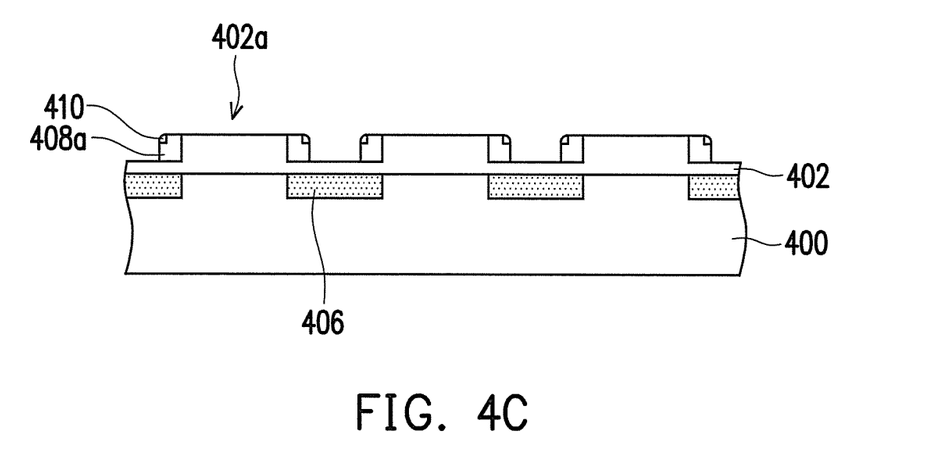

Referring to FIG. 4C, an isotropic etching process is performed to remove a portion of the oxide material layer 410 and a portion of the charge storage material layer 408 so as to form a pair of charge storage spacers 408a on the sidewalls of each protrusion 402a. Similar to the first embodiment, the size of the charge storage spacers 408a can be controlled by adjusting the thickness of the charge storage material layer 408 formed. In the present embodiment, the thickness of the charge storage material layer 408 ranges from 40 Å to 80 Å, for example. Accordingly, the size of the charge storage spacers 408a is prevented from being too small so as to affect the ability of the memory to store charges.

Figure 4D:
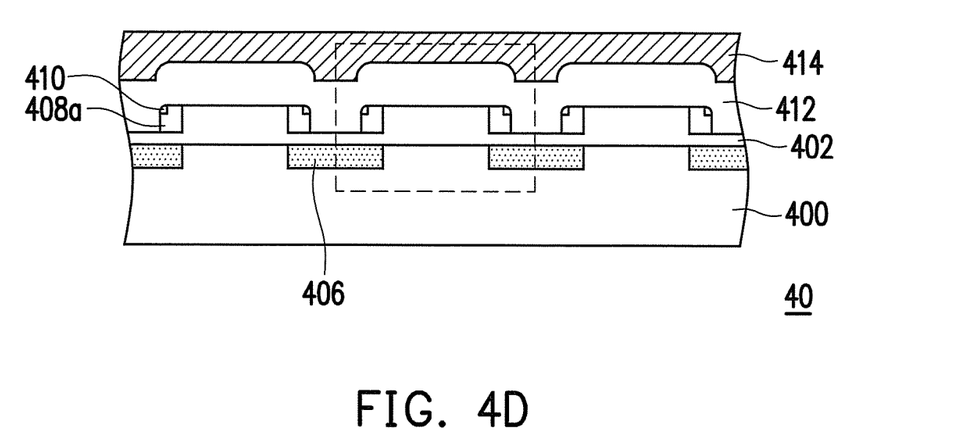

Referring to FIG. 4D, an oxide layer 412 is formed on the oxide layer 402, the charge storage spacers 408a, and the oxide material layer 410 remained. A method of forming the oxide layer 412 is, for example, a CVD method. A conductive layer 414 is then formed on the oxide layer 412 to form a non-volatile memory 40. A method of forming the conductive layer 414 is, for example, a CVD method. The conductive layer 414 is, for instance, a polysilicon layer.

The non-volatile memory 40 includes a plurality of memory cells as shown with dotted lines. Here, the oxide layer 402, the pair of charge storage spacers 408a, the oxide material layer 410, and the oxide layer 412 constitute a charge storage structure (the oxide layer 402, the oxide material layer 410, and the oxide layer 412 together are referred as a dielectric main body). The doped regions 406 disposed on the two sides of the charge storage structure are used as a source region and a drain region respectively. The conductive layer 414 is utilized as a gate. Similar to the non-volatile memory 10, the second bit effect can be prevented when performing the read operation to the memory cells of the non-volatile memory 40 and the program disturbance of adjacent memory cells can be prevented during the program operation.

Fifth Embodiment

Figure 5A:
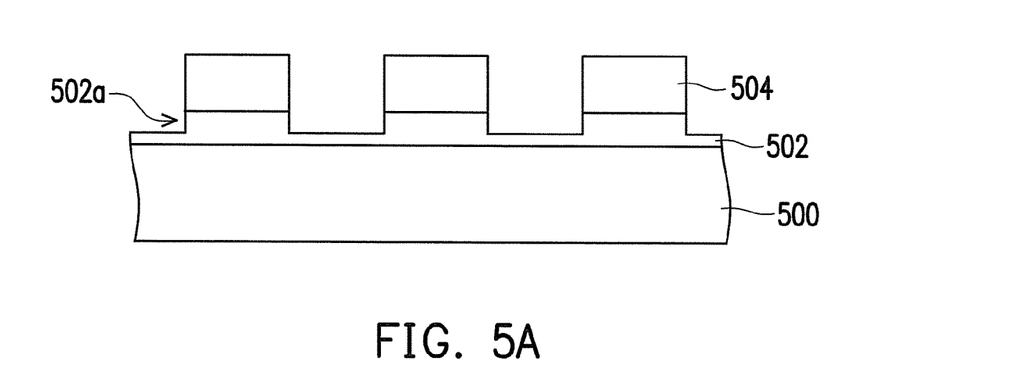
FIGS. 5A to 5E are schematic cross-sectional diagrams showing a flowchart for manufacturing a non-volatile memory according to a fifth embodiment of the invention.

FIGS. 5A to 5E are schematic cross-sectional diagrams showing a flowchart for manufacturing a non-volatile memory according to a fifth embodiment of the invention. Referring to FIG. 5A, an oxide layer 502 having a protrusion 502a is formed on a substrate 500. The oxide layer 502 is formed by forming an oxide material layer on the substrate 500, for example. A method of forming the oxide material layer is, for example, a CVD method. Thereafter, a patterning mask layer 504 is formed on the oxide material layer. The patterning mask layer 504 covers a region for forming the protrusion in the oxide layer 502. Afterwards, the patterning mask layer 504 is used as a mask to perform an isotropic etching process so as to remove a portion of the oxide material layer without exposing the substrate 500 to form the protrusions 502a.

Figure 5B:
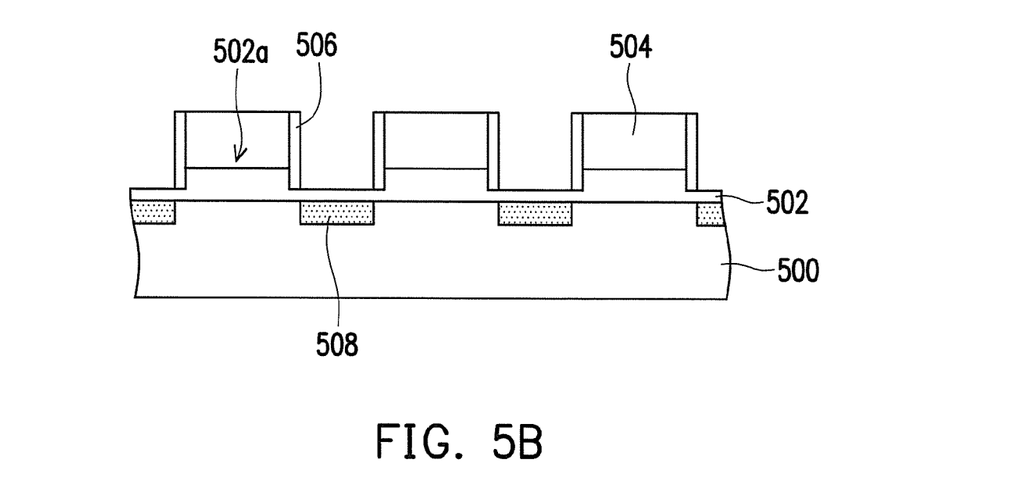

Referring to FIG. 5B, a pair of charge storage spacers 506 is formed on the sidewalls of the patterning mask layer 504 and the protrusions 502a. A method of forming the charge storage spacers 506 includes the following. For example, a charge storage material layer is formed conformally on the oxide layer 502. A material of the charge storage material layer comprises nitride, polysilicon, high-k material, $Hf_xO_y$, $HfO_xN_y$, $Al_xO_y$, or $Hf_xAl_yO_z$, for example. An isotropic etching process is performed to remove a portion of the charge storage material layer. The patterning mask layer 504 and the charge storage spacers 506 are used as a mask to perform an ion implantation process to form the doped regions 508.

Similar to the third embodiment, in the present embodiment, the doped regions 508 at two sides of each protrusion 502a have a larger distance therebetween. As a result, the short channel effect and the punch through effect generated and affecting the device performance in the operation process of the memory subsequently formed can be prevented.

Figure 5C:
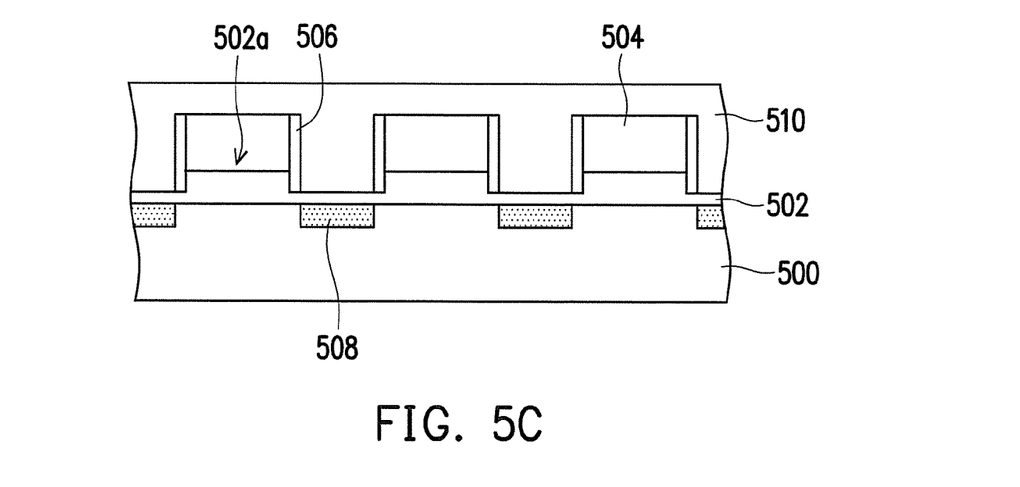

Referring to FIG. 5C, an oxide layer 510 is formed on the oxide layer 502 to cover the patterning mask layer 504, the plurality of charge storage spacers 506, and the oxide layer 502. A method of forming the oxide layer 510 is, for example, a CVD method.

Figure 5D:
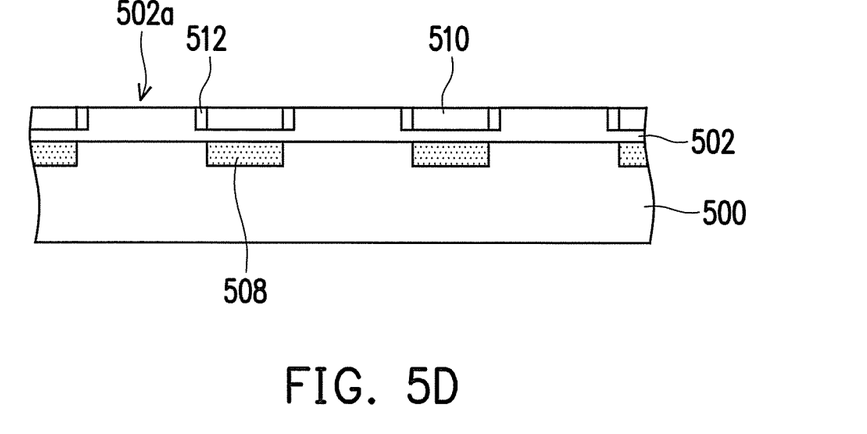

Referring to FIG. 5D, the patterning mask layer 504 is removed. A method of removing the patterning mask layer 504 includes the following. For instance, a planarization process (e.g. a chemical mechanical polishing process) is performed to remove the patterning mask layer 504, a portion of the charge storage spacers 506, and a portion of the oxide layer 510 until the protrusions 502a are exposed so that a pair of charge storage spacers 512 is formed on the sidewalls of the protrusion 502a.

Figure 5E:
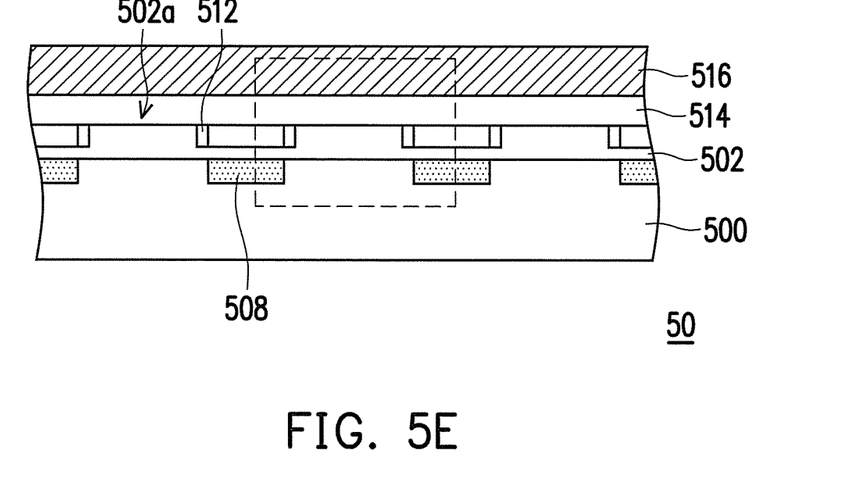

Referring to FIG. 5E, an oxide layer 514 is formed on the oxide layer 502 and the charge storage spacers 512. A method of forming the oxide layer 514 is, for example, a CVD method. A conductive layer 516 is then formed on the oxide layer 514 to form a non-volatile memory 50. A method of forming the conductive layer 516 is, for example, a CVD method. The conductive layer 516 is, for instance, a polysilicon layer.

The non-volatile memory 50 includes a plurality of memory cells as shown with dotted lines. Here, the oxide layer 502, the pair of charge storage spacers 512, and the oxide layer 514 constitute a charge storage structure (the oxide layer 502 and the oxide layer 514 together are referred as a dielectric main body). The doped regions 508 disposed at two sides of the charge storage structure are used as a source region and a drain region respectively. The conductive layer 516 is utilized as a gate. Similar to the non-volatile memory 10, the second bit effect can be prevented when performing the read operation to the memory cells of the non-volatile memory 50 and the program disturbance of adjacent memory cells can be prevented during the program operation. Furthermore, in the non-volatile memory 50, since a larger distance is present between the source region and the drain region, the short channel effect and the punch through effect are prevented in the operation process.

In each of the memory cells of the non-volatile memories 10, 20, 30, 40, 50, two charge storage spacers used to store charges are separated from each other and disposed in mirror symmetry. Moreover, in each of the memory cells of the non-volatile memories 10, 20, 30, two charge storage spacers have a curved surface or a slanted surface respectively, where the curved surfaces or the slanted surfaces of the two charge storage spacers are away from each other. In addition, in each of the memory cells of the non-volatile memory 40, the two charge storage spacers 408a have an L shape respectively and horizontal portions in the two L-shaped charge storage spacers 408a extend away from each other.

It should be noted that in the process of manufacturing the charge storage spacers 408a of the non-volatile memory 40, after the charge storage material layer 408 is formed, an oxide material layer 410 is formed on the charge storage material layer 408. Thereafter, an isotropic etching process is performed to form the charge storage spacers 408a. Thus, comparing to the charge storage spacers in each memory cell of the non-volatile memories 10, 20, 30, the charge storage spacers 408a can have larger volume and therefore, the storaged charges may be close to the doped regions to effectively prevent the generation of second bit effect and program disturbance in operation.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A manufacturing method of a non-volatile memory, comprising:
    forming a first oxide layer on a substrate, the first oxide layer having a protrusion;
    forming a pair of doped regions in the substrate at two sides of the protrusion;
    forming a pair of charge storage spacers on the sidewalls of the protrusion;
    forming a second oxide layer on the first oxide layer and the pair of charge storage spacers; and
    forming a gate on the second oxide layer, wherein the gate is located completely above the topmost portion of the pair of charge storage spacers.

2. The manufacturing method of the non-volatile memory as claimed in claim 1, wherein a method of forming the first oxide layer comprises:
    forming a first oxide material layer on the substrate;
    forming a patterning mask layer on the first oxide material layer;
    using the patterning mask layer as a mask to remove a portion of the first oxide material layer to form the protrusion; and
    removing the patterning mask layer.

3. The manufacturing method of the non-volatile memory as claimed in claim 2, wherein the substrate located at two sides of the protrusion is not exposed after a portion of the first oxide material layer is removed.

4. The manufacturing method of the non-volatile memory as claimed in claim 3, wherein after the protrusion is formed and before the patterning mask layer is removed, the patterning mask layer is adopted as the mask to perform an ion implantation process to form the pair of doped regions.

5. The manufacturing method of the non-volatile memory as claimed in claim 4, wherein a method of forming the pair of charge storage spacers comprises:
    forming a charge storage material layer on the first oxide layer conformally; and
    performing an isotropic etching process to remove a portion of the charge storage material layer.

6. The manufacturing method of the non-volatile memory as claimed in claim 4, wherein a method of forming the pair of charge storage spacers comprises:
    forming a charge storage material layer on the first oxide layer conformally;
    forming a second oxide material layer on the charge storage material layer; and performing an isotropic etching process to remove a portion of the second oxide material layer and a portion of the charge storage material layer.

7. The manufacturing method of the non-volatile memory as claimed in claim 3, wherein after the protrusion is formed and before the patterning mask layer is removed, the manufacturing method further comprises:
   forming a pair of nitride spacers on the sidewalls of the patterning mask layer and the protrusion; and
   using the patterning mask layer and the pair of nitride spacers as a mask to perform an ion implantation process to form the pair of doped regions.

8. The manufacturing method of the non-volatile memory as claimed in claim 7, wherein the pair of nitride spacers is removed while removing the patterning mask layer.

9. The manufacturing method of the non-volatile memory as claimed in claim 7, wherein a method of forming the pair of charge storage spacers comprises:
   forming a charge storage material layer on the first oxide layer conformally; and
   performing an isotropic etching process to remove a portion of the charge storage material layer.

10. The manufacturing method of the non-volatile memory as claimed in claim 7, wherein after the pair of doped regions is formed and before the patterning mask layer is removed, the manufacturing method further comprises forming a third oxide layer to cover the patterning mask layer, the pair of nitride spacers, and the first oxide layer.

11. The manufacturing method of the non-volatile memory as claimed in claim 10, wherein a method of removing the patterning mask layer comprises performing a planarization process to remove the patterning mask layer, a portion of the pair of nitride spacers, and a portion of the third oxide layer until the protrusion is exposed and the pair of charge storage spacers is formed.

12. The manufacturing method of the non-volatile memory as claimed in claim 2, wherein the substrate located at two sides of the protrusion is exposed after a portion of the first oxide material layer is removed.

13. The manufacturing method of the non-volatile memory as claimed in claim 12, wherein after the protrusion is formed and before the patterning mask layer is removed, the patterning mask layer is adopted as the mask to perform an ion implantation process to form the pair of doped regions.

14. The manufacturing method of the non-volatile memory as claimed in claim 13, wherein a method of forming the pair of charge storage spacers comprises:
   forming a third oxide layer conformally on the substrate;
   forming a charge storage material layer on the third oxide layer conformally; and
   performing an isotropic etching process to remove a portion of the charge storage material layer.

15. The manufacturing method of the non-volatile memory as claimed in claim 1, wherein a material of the charge storage spacers comprises nitride, polysilicon, high-k material, $Hf_xO_y$, $HfO_xN_y$, $Al_xO_y$ or $Hf_xAl_yO_z$.

* * * * *